Jan. 5, 1965 E. P. McGROGAN, JR 3,164,826
ANALOG TO DIGITAL CONVERTER INCLUDING COMPARATOR COMPRISING TUNNEL DIODE BALANCED PAIR
Filed May 31, 1962
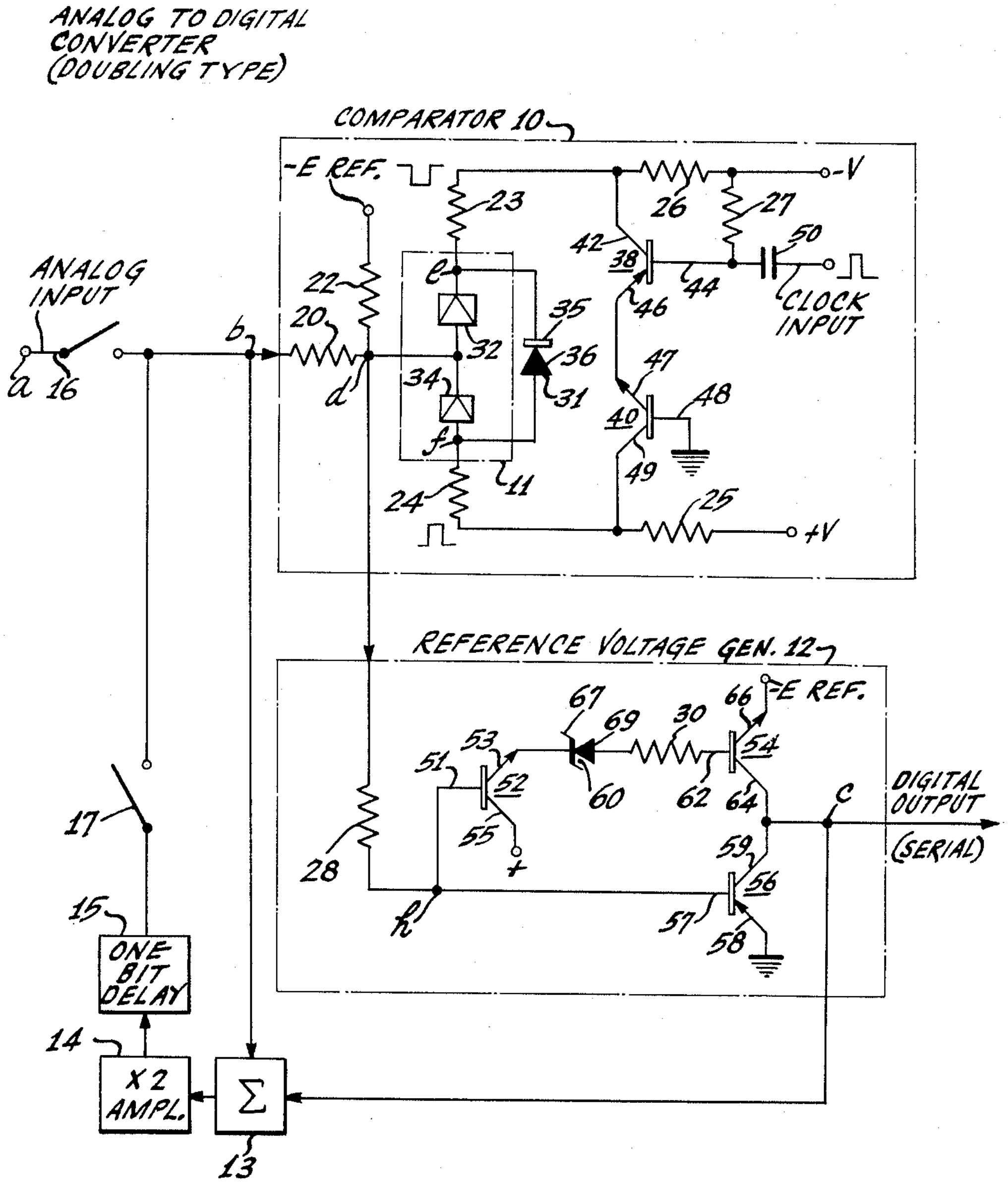
INVENTOR.
ELLWOOD P. McGROGAN, JR.
BY John V. Regan
ATTORNEY United States Patent Office 3,164,826
Patented Jan. 5, 1965

3,164,826

ANALOG TO DIGITAL CONVERTER INCLUDING COMPARATOR COMPRISING TUNNEL DIODE BALANCED PAIR

Ellwood P. McGrogan, Jr., Cherry Hill, N.J., assignor to Radio Corporation of America, a corporation of Delaware Filed May 31, 1962, Ser. No. 199,190
8 Claims. (Cl. 340—347)

This invention relates in general to signal amplitude comparator circuits for determining which of two input signals is larger. The invention is useful, for example, in digital logic systems, data processing apparatus, and analog to digital converters.

It is a general object of the invention to provide an improved simple and reliable comparator circuit capable of performing an amplitude comparison of two signals with great accuracy in a very short period of time.

It is another object to provide a comparator circuit for two input signals which provides an output whenever an input clock pulse is applied to the circuit.

It is a further object to provide an improved comparator circuit wherein the output signal is a pulse of one polarity or the other polarity.

It is yet another object to provide an improved comparator circuit providing an output at zero volts or a predetermined voltage depending on whether an input signal is less than or greater than the predetermined voltage.

It is a still further object to provide an improved energizing circuit for a tunnel diode balanced pair.

Briefly stated, the invention comprises two tunnel diodes connected cathode to anode in the manner of a balanced pair having an intermediate signal terminal and two end terminals. Each of the tunnel diodes has a high voltage stable state and a low voltage stable state of operation. A series circuit including the current path electrodes of two transistors is coupled across the end terminals of the tunnel diode balanced pair circuit. A bias potential source connected across the series circuit normally causes a current flow through the transistors. Very little, if any, current flows through the tunnel diodes so they remain in their low voltage states. When a clock pulse is applied to a control electrode of the transistors of the series circuit, the transistors are rendered non-conductive for the duration of the clock pulse. The current from the bias potential source then flows through the tunnel diodes and causes one of them to switch to its high voltage state, the particular one depending on the relative amplitudes of input and reference signals applied to the intermediate signal terminal of the tunnel diode pair. An output signal is available at the intermediate signal terminal.

In the accompanying drawing, the sole figure shows a comparator circuit according to the invention included, by way of example, in a doubling type analog-to-digital converter system.

Referring to the drawing, there is shown an input terminal *a* to which an analog signal may be applied. One terminal of switch 16, shown as a toggle switch as a matter of convenience of illustration only, is coupled to terminal *b*, the input terminal of the comparator circuit 10, and to switch 17, also shown as a toggle switch. Terminal *b* is coupled through resistor 20 to a midpoint *d* between tunnel diodes 34 and 32, connected in a series circuit cathode-to-anode in the manner of a balanced pair. A tunnel diode balanced pair is described in French Patent No. 1,246,094, of January 27, 1960, to Arthur W. Lo. A negative reference voltage $-E_{ref}$ is coupled via resistor 22 to the midpoint *d* of the balanced pair circuit 11. The analog signal applied at input *a* is compared to the reference voltage $-E_{ref}$ so that when the analog signal amplitude is larger than the reference voltage a positive output signal is provided at terminal *d*, and when the analog signal amplitude is smaller than the reference voltage a negative output is provided at terminal *d*. The anode of tunnel diode 34 is coupled through resistors 24 and 25, connected in series, to a source of positive bias potential +V. The cathode of tunnel diode 32 is coupled through resistors 23 and 26, connected in series, to a source of negative bias potential −V. A conventional diode 36 is connected at points *e* and *f* across the tunnel diodes 32, 34 and operates to restrict the voltage across the tunnel diodes 34 and 32 to a value so that only one of the tunnel diodes is able to operate in its high voltage state at one time. The anode 31 of diode 36 is connected to the anode of tunnel diode 34, and the cathode 35 of diode 36 is connected to the cathode electrode of tunnel diode 32.

Opposite type conductivity transistors 38 and 40 are connected in a series circuit across the balanced pair 11. The collector electrodes 42 and 49 of transistors 38 and 40 respectively, are coupled through resistors 26 and 25, respectively, to sources of bias potential −V and +V. Bias potential −V is coupled through resistor 27 to the base electrode 44 of transistor 38 to bias transistor 38 normally to be conductive, so that current flows from the bias source +V. The current paths through the transistors are collector-emitter and emitter-collector respectively. The base electrode 48 of transistor 40 is connected to a reference bias potential indicated in the drawing as ground. Capacitor 50, which is connected to the base electrode 44 of transistor 38, couples input clock pulses to the transistor 38 to render transistors 38 and 40 non-conducting.

The common terminal *d* of the balanced pair 11 is coupled through a resistor 28 to the input terminal *h* of the reference voltage generator 12.

The reference voltage generator 12 includes a circuit of transistors 52, 54 and 56. The input terminal *h* of the reference voltage generator 12 is coupled to the base electrodes 51 and 57 of transistors 52 and 56 respectively. The collector electrode 55 of transistor 52 is coupled to a positive bias potential. The emitter electrode 53 of transistor 52 is coupled through a series circuit comprising Zener diode 60 and resistor 30 to the base electrode 62 of transistor 54. The emitter electrode 66 of transistor 54 is coupled to a source of bias potential $-E_{ref}$ and the collector electrode 64 of transistor 54 is directly connected to the collector electrode 59 of transistor 56. The connection of collector electrodes 64 and 59 constitute the output terminal *c* of the reference voltage generator 12. The emitter electrode 58 of transistor 56 is connected to ground. Transistors 52 and 54 are of one conductivity type (here N type) and transistor 56 is of the opposite conductivity type (P type in this case) so that, depending on the polarity of the input signal at terminal *h*, either transistors 52 and 54 conduct or transistor 56 conducts.

The output of the reference voltage generator 12 is coupled to an input of a summing circuit 13, which comprises two resistors (not shown). The analog input applied to terminal *a* is also coupled to another input of the summing circuit 13. The output of the summing circuit is the difference between the analog signal and the output signal from the reference voltage generator 12. The output from the summing circuit 13 is coupled to an input of a ×2 amplifier 14, which operates to double the amplitude of the signal from the summing circuit 13. The output signal of the ×2 amplifier 14 is delayed by the delay circuit 15. Once the analog signal is compared in the comparator circuit 10 and the reference voltage generator is activated, the first bit of the digital number is obtained at the output terminal *c*. The signal from the ×2 amplifier and delay 15 then determines the second bit, and so on.

As it is known, the current-voltage characteristic of a tunnel diode comprises a low voltage positive resistance region, a current peak, an intermediate voltage negative resistance region, a current valley, and a high voltage positive resistance region. The tunnel diodes 32 and 34, in the balanced pair circuit 11, are biased to assume two stable states of operation in their positive resistance regions, respectively. Pulses of opposite polarity and equal magnitude are applied simultaneously to the supply terminals *e* and *f* of the balanced pair 11. Upon the application of the supply pulses, absent any input signal, only one tunnel diode assumes a stable state of operation in its high voltage positive resistance region. This, however, is due to the noise present or to inequalities of the tunnel diodes or to a small difference in the amplitude of the power supply pulses. However, when an input signal is applied to the midpoint between the diodes, the polarity of this signal determines which one of the two diodes is biased closer to its current peak. Now when the supply pulses are applied the tunnel diode biased closer to its current peak switches to its high voltage stable state.

In operation, an analog input signal is coupled through switch 16, to input terminal *b* of comparator circuit 10, a reference voltage of opposite polarity is coupled through resistor 22 to terminal *d* so that the midpoint of the balanced pair circuit, is biased to either a positive or a negative potential depending on the magnitude of the analog signal with respect to the reference voltage $-E_{ref}$. The driver circuit or power supply for the balanced pair 11 comprises transistors 38 and 40 which are biased normally to be conducting. Current normally flows through transistors 40 and 38 from bias potential source +V and into bias potential source −V. Because the base electrode 48 of transistor 40 is connected to ground, the potential at collector electrodes 42 and 49 is normally close to ground potential. When a positive clock pulse is coupled through capacitor 50 to the base electrode 34 of transistor 38, both transistors 38 and 40 are rendered non-conductive, and the current flowing through the transistors is steered through the tunnel diodes. The potential of collector electrode 42 rises towards −V, and the potential of collector electrode 49 rises towards +V providing simultaneous supply pulses to the supply terminals *e* and *f* of the balanced pair circuit 11. When the supply pulses are applied to supply terminals *e* and *f* either tunnel diode 32 or tunnel diode 34 switches to its high voltage stable state depending on whether the analog signal is larger than the reference voltage $-E_{ref}$ (diode 32 switches) or smaller than $-E_{ref}$ (diode 34 switches).

The output from comparator circuit 10 is coupled to the input terminal *h* of the reference voltage generator 12. The output signal from generator 12 comprises two signal levels; $-E_{ref}$ when the signal at terminal *h* is positive with respect to ground, and ground potential when the signal at terminal *h* is negative with respect to ground. When the signal at terminal *h* is negative with respect to ground, transistor 56 is rendered conductive.

When the signal at terminal *h* is positive, however, transistor 56 is rendered non-conductive, and transistor 52 is rendered conductive. Current flows through Zener diode 60 into the base electrode 62 of transistor 54 so that the potential at collector electrode 64 of transistor 54 becomes $-E_{ref}$ and the level of the output signal at terminal *c* is $-E_{ref}$.

The output for the reference voltage generator is then coupled to the summing circuit 13, which receives at its other input terminal the analog input signal applied at terminal *b*.

In order to better understand the operation of an analog-to-digital converter which includes a comparator-reference-voltage-generator according to the invention, a specific example may be helpful. Assume that an analog signal voltage having a value of 5 volts is desired to be converted into a binary number which represents 5, i.e., 101, each volt representing one unit, and that the largest binary number to be represented is 7, so that only 3 bits are needed. The operation is as follows: Switch 16 is closed and switch 17 is opened. A reference voltage of −3½ volts is coupled through resistor 22 to terminal *d*, and the 5 volts signal voltage is coupled through resistor 20 to terminal *d*. The net value of the signal applied at terminal *d* is positive (the analog signal being larger than the reference voltage). When the clock pulse is applied, the supply voltages are applied across the tunnel diode pair 11 and tunnel diode 32 switches to its high voltage stable state. A positive voltage is coupled to terminal *h*, which in turn renders transistor 52, Zener diode 60, and transistor 54 conductive. The output signal at terminal *c* has a value of $-E_{ref}$ (3½ volts). This output constitutes the most significant bit of the desired binary number, in this case binary one. The summing circuit 13 subtracts the output of circuit 12 from the analog signal, and the output in this case is +1½ volts. The one and one-half volt output from the summing circuit 13 is doubled by circuit 14 and coupled through the delay circuit 15. The switch 17 is now closed to couple the three volt signal back to terminal *b* of comparator circuit 10. Also at this time the original analog signal has been switched off by switch 16. The switches illustrated here as toggle switches may be of electronic or other suitable type and are opened and closed by any suitable means, for example, are synchronized with the clock pulse.

The comparator circuit 10 now compares in similar manner the new input voltage, three volts, to the same reference voltage −3½ volts. Tunnel diode 34 switches to its high voltage state of operation this time because the reference voltage is larger than the recycled input signal. A negative voltage is coupled to terminal *h* which renders transistor 56 conductive. The lever of the output signal at terminal *c* now is ground potential. This output signal at terminal *c* represents a binary zero, and it is the second most significant bit of the desired binary number. The summing circuit 13 now passes through the three volts applied from terminal *b*, the output from terminal *c* being ground potential, and the circuit 14 doubles it and couples it back to terminal *b* through the delay circuit 15. The new input at terminal *b*, 6 volts, switches tunnel diode 32 to its high stable state of operation and a positive pulse is coupled to input terminal *h* of the reference voltage generator 12. The positive signal at terminal *h* renders transistor 52, Zener diode 60 and transistor 54 to be conductive and the output signal at terminal *c* is $-E_{ref}$ which represents a binary one. After the signal was recycled back to the input terminal *b* the last time, switch 17 opens and switch 16 closes so that the circuit is ready for the next sampling time of the analog signal.

Although the invention has been described in connection with an analog-to-digital converter, it is to be understood that the circuit may be used in many other sysems and circuits that require a fast and accurate comparator.

What is claimed is:

1. In a comparator, the comprising relatively high voltage and low voltage bias source terminals, two similarly poled tunnel diodes connected in a series circuit between said high voltage and low voltage terminals, two opposite conductivity type transistors having current path electrodes connected in series across said two tunnel diodes, and means coupled to control the conductivity of said transistors to steer current from said bias source terminals either through the transistors or through the tunnel diodes.

2. In a comparator, the combination comprising relatively high voltage, intermediate voltage and low voltage bias source terminals, two similarly poled tunnel diodes connected in a series circuit between said high voltage and low voltage terminals, two opposite conductivity type transistors having current path electrodes connected in series across said two tunnel diodes and having control electrodes, means connecting said intermediate voltage bias terminal to the control electrode of one of said transistors, and means to apply pulses to the control electrode of the other one of said transistors to control the conductivity of the transistors and thereby steer current from said bias source either through the transistors or the tunnel diodes.

3. A comparator comprising positive voltage, a reference voltage and negative voltage bias source terminals, two similarly poled tunnel diodes connected in a series circuit between said positive and negative terminals, first and second opposite conductivity type transistors having current path electrodes connected in series across said two tunnel diodes and having control electrodes, means connecting the control electrode of said first transistor to said reference voltage source, means for applying pulses selectively to the control electrode of said second transistor to control the conductivity of the transistors and thereby steer current from said bias source either through the transistors or the tunnel diodes, a diode connected across said two tunnel diodes to limit the voltage thereacross when current is directed through the tunnel diodes to a value permitting one and only one of the tunnel diodes to switch to its high voltage state, means to apply an input signal and an opposite polarity reference voltage to the junction between said tunnel diodes, whereby one or the other of the tunnel diodes switches, when current is steered through the tunnel diodes, depending on the relative amplitude of the input signal, and means to derive an output signal from the junction between said tunnel diodes.

4. An analog to digital converter comprising positive voltage, ground and negative voltage bias source terminals, two similarly poled tunnel diodes connected in a series circuit between said positive and negative terminals, first and second opposite conductivity type transistors having current path electrodes connected in series across said two tunnel diodes and having control electrodes, means connecting the control electrode of said first transistor to ground, means to apply pulses to the control electrode of said second transistor to control the conductivity of the transistors and thereby steer current from said bias source either through the transistors or the tunnel diodes, a reference voltage source, means coupling said reference voltage source and an opposite polarity input signal to the junction between said tunnel diodes, whereby one or the other of the tunnel diodes switches, when current is steered through the tunnel diodes, depending on the relative amplitude of the input signal, third and fourth opposite conductivity type transistors having current path electrodes connected in series between said reference voltage source and ground and having control electrodes, means coupling the positive or negative output signal from the junction between said tunnel diodes to the control electrodes of said third and fourth transistors to selectively render one or the other conductive, and means to derive an output from the junction between said third and fourth transistors which is either at said reference voltage value or ground.

5. An analog to digital converter circuit for comparing an input signal with an opposite polarity reference signal comprising, two tunnel diodes connected in series in the manner of a balanced pair with an intermediate signal terminal and end terminals, means to apply said reference signal and said input signal to said signal terminal, a circuit for supplying simultaneous opposite polarity supply pulses with respect to a reference potential to said end terminals, said supply circuit including two opposite conductivity type transistors each having base, emitter and collector electrodes, said emitter electrodes being connected together, a first resistor for coupling a positive bias potential to one of said collector electrodes, a second resistor for coupling a negative bias potential to the other of said collector electrodes, means coupling said base electrode of one of said two transistors to said reference potential, means biasing said transistors normally to be conductive, means for applying a pulse to the base electrode of the other of said two transistors so that both said transistors are rendered non-conductive for the duration of said pulse, means respectively coupling each one of said collector electrodes to a different one of said end terminals, and means to derive an output signal from said signal terminal.

6. An analog to digital converter circuit comprising, a balanced pair circuit comprising two tunnel diodes, each having a cathode electrode and an anode electrode and each having a low voltage stable state of operation and a high voltage state of operation, said stable states of operation being low and high relative to each other, said tunnel diodes being connected cathode-to-anode and being coupled at their anode and cathode respectively to opposite polarity bias potential sources, said balanced pair circuit having a signal terminal constituted by the cathode-anode connection of said diodes and two end terminals, a series circuit comprising first and second opposite conductivity type transistors, each having an emitter electrode, a collector electrode and a base electrode, said series circuit being coupled between said opposite polarity bias potential sources so that current flows from the positive polarity bias source through the collector-emitter path of said first transistor and through the emitter-collector path of said second transistor to the negative polarity bias source, means biasing said base electrode of said first transistor to a reference potential, means coupling pulses to the base electrode of said second transistor, said pulses being of a polarity and magnitude to render said first and second transistors non-conductive, means coupling said collector electrodes of said first and second transistors to said end terminals of said balanced pair so that pulses of opposite polarity are simultaneously applied to said end terminals, and means coupling an input signal and an opposite polarity reference signal to said signal terminal, so that the resulting signal applied to said signal terminal together with said opposite polarity pulses switches only one of said diodes to its high stable state of operation, the amplitude of said variable signal being the determining factor on which one of said diodes switches to its high voltage state.

7. In an electrical circuit, the combination comprising a pair of similarly poled tunnel diodes connected in series, a transistor having input, output, and control electrodes, means connecting said input and output electrodes of said transistor across said pair of tunnel diodes, means coupled to bias said transistor into conductivity, and means coupled to apply pulses to said control electrode of said transistor to control the conductivity of said transistor to steer current from said biasing means either through said transistor or through said diodes.

8. In an electrical circuit, the combination comprising a pair of similarly poled tunnel diodes connected in series, a transistor having input, output, and control electrodes, means for connecting said input and output electrodes of said transistor across said pair of tunnel diodes, a unilaterally conducting diode coupled across and poled in the same direction as said pair of tunnel diodes, means for biasing said transistor to conductivity, and means for applying pulses to said control electrode of said transistor to control the conductivity of said transistor to steer current from said biasing means either through the transistor or through said diodes.

References Cited in the file of this patent

UNITED STATES PATENTS 3,056,049 Baird ---------------- Sept. 25, 1962

3,075,087 Lo -------------------- Jan. 22, 1963